United States Patent
Zenke

[11] Patent Number: 5,811,333
[45] Date of Patent: Sep. 22, 1998

[54] METHOD OF ROUGHENING A POLYSILICON LAYER OF A RANDOM CRYSTAL STRUCTURE INCLUDED IN A SEMICONDUCTOR DEVICE

[75] Inventor: Masanobu Zenke, Tokyo, Japan

[73] Assignee: NEC Corporation, Tokyo, Japan

[21] Appl. No.: 585,717

[22] Filed: Jan. 11, 1996

[30] Foreign Application Priority Data

Jan. 13, 1995 [JP] Japan ................................... 7-019954

[51] Int. Cl.⁶ .............................................. H01L 21/8242
[52] U.S. Cl. ............................ 438/255; 438/398; 438/964
[58] Field of Search .................................. 438/239, 255, 438/398, 964

[56] References Cited

U.S. PATENT DOCUMENTS

| | | | |
|---|---|---|---|
| 4,904,611 | 2/1990 | Chiang et al. | 438/255 |
| 5,162,073 | 11/1992 | Aronoff et al. | 156/625 |
| 5,266,514 | 11/1993 | Tuan et al. | 438/255 |
| 5,290,729 | 3/1994 | Hayashide et al. | 438/255 |
| 5,372,962 | 12/1994 | Hirota et al. | 438/255 |

FOREIGN PATENT DOCUMENTS

| | | |
|---|---|---|
| 3-139882 | 6/1991 | Japan . |
| 3-272165 | 12/1991 | Japan . |
| 4-320370 | 11/1992 | Japan . |

*Primary Examiner*—Jey Tsai

[57] ABSTRACT

On a semiconductor substrate (1), a polysilicon layer (3) of a random crystal structure is formed. The polysilicon layer (3) is treated by an etchant to provide a roughened surface (3a) of the polysilicon layer (3). The roughened surface (3a) is formed along grains of a random crystal structure and extends over all of top and side surfaces of the polysilicon layer (3). Thus, the polysilicon layer (3) serves as a lower electrode (4) having an increased surface area. A capacitor insulator layer (5) is deposited on the lower electrode (4). An upper electrode (6) is deposited on the capacitor insulator layer (5).

20 Claims, 7 Drawing Sheets

METHOD OF ROUGHENING A POLYSILICON LAYER OF A RANDOM CRYSTAL STRUCTURE INCLUDED IN A SEMICONDUCTOR DEVICE

BACKGROUND OF THE INVENTION

This invention relates to an element included in a semiconductor device and, in particular, to a method of manufacturing the element. Herein, it is to be noted throughout the instant specification that a capacitor alone will be exemplified as such an element in the following description.

A semiconductor device, such as a dynamic random access memory (DRAM), is required to have a capacitor structure in the form of a stacked capacitor or a trench capacitor. The stacked capacitor comprises a stack of a lower electrode, a capacitor insulator layer, and an upper electrode successively deposited on a semiconductor substrate. On the other hand, the trench capacitor is manufactured by forming a trench in a semiconductor substrate to provide a capacitor arrangement in the trench.

Thus, the stacked capacitor is manufactured through a comparatively simple process and is therefore advantageous as compared with the trench capacitor.

Herein, it is to be noted that a recent demand for a highly integrated semiconductor device is directed to the stacked capacitor which has a small area. This makes it difficult to realize a large capacitance by the stacked capacitor. This is because the capacitance is determined by an effective surface area defined by opposing surfaces of the upper and the lower electrodes.

In view of the above, proposal has been made about microscopically roughening the lower electrode in order to substantially widen or expand the effective surface area relative to a reference flat area. For example, Japanese Unexamined Patent Publication No. 272165/1991 discloses a first technique of roughening a surface of a polysilicon layer. Practically, roughening the surface of the polysilicon layer can be accomplished by depositing the polysilicon layer at a growth temperature within a transition temperature range. This is because a deposited layer is transformed within the transition temperature range from an amorphous phase to a polysilicon phase. As a result, the polysilicon layer has a roughened surface resulting from growth of silicon grains. At any rate, the effective surface area is increased.

Japanese Unexamined Patent Publication No. 320370/1992 discloses a second technique of providing a roughness on a surface of a lower electrode by depositing a pin-holed silicon nitride layer on a polysilicon layer and by etching the polysilicon layer through pinholes to form the lower electrode.

Japanese Unexamined Patent Publication No. 139882/1991 discloses a third technique of providing a roughness by etching a surface of a polysilicon layer with a hot phosphoric acid solution. In this technique, highly concentrated silicon along grain boundaries in the polysilicon layer is etched to roughen the surface of the polysilicon layer.

U.S. Pat. No. 5,266,514 discloses a fourth technique of providing a roughness. Specifically, an amorphous silicon layer is deposited by a low pressure chemical vapor deposition (LPCVD) method. In this event, an impurity, such as phosphorus, is introduced into the amorphous silicon layer. Then, the amorphous silicon layer is subjected to a heat treatment to be transformed into a polysilicon layer having a substantially uniform grain size between about 0.3 to 1.0 $\mu$m. The polysilicon layer is patterned in the form of a desired electrode. Thereafter, the polysilicon layer is etched by a hot phosphoric acid solution to provide a roughened surface.

All of the above-mentioned conventional techniques of roughening a surface of a polysilicon layer used as a lower electrode serve to widen an effective surface area. Therefore, the techniques enable realization of a large capacitance by the stacked capacitor. However, the above-mentioned conventional techniques have disadvantages which will be described hereinunder.

The first conventional technique disclosed in Japanese Unexamined Patent Publication No. 272165/1991 utilizes the growth at the growth temperature within the transition temperature range in which the deposited layer is transformed from the amorphous phase into the polysilicon phase. However, the growth temperature must be strictly controlled within the transition temperature range which is very narrow. Beyond such a very narrow temperature range, the surface of the polysilicon layer is not roughened but undesirably flattened. In addition, when an LPCVD apparatus is repeatedly operated to manufacture a great number of products, such as the stacked capacitor, the roughness of the surface often fluctuates or varies due to presence of foreign particles. This makes it difficult to provide the roughness on the surface with an excellent reproducibility and a high stability. Thus, this technique is not effective in view of mass production of semiconductor devices.

The second conventional technique disclosed in Japanese Unexamined Patent Publication No. 320370/1992 utilizes the pin-holed silicon nitride layer in order to roughen the surface of the polysilicon layer. Such a pin-holed silicon nitride layer can not be formed with a high reproducibility because pinholes can not readily be controlld in number and size. Thus, this technique is not suitable for mass production of semiconductor devices or elements.

The third conventional technique disclosed in Japanese Unexamined Patent Publication No. 139882/1992 etches the polysilicon layer along the grain boundaries by the use of the phosphoric acid solution in order to roughen the polysilicon layer. It is noted here that the polysilicon layer generally includes grains each of which has a columnar shape extended in a vertical direction. Although this technique serves to provide a large roughness on a top surface of the polysilicon layer formed by tops of the columnar-shape grains, side surfaces of the columnar-shape grains are never roughened. As a result, the roughened surface is restricted to the top surface alone and is not increased in area to more than 1.3 times the polysilicon layer which is not roughened.

The fourth technique disclosed in U.S. Pat. No. 5,266,514 utilizes transformation of the amorphous silicon layer into the polysilicon layer formed by grains which have a uniform grain size between 0.3 and 1.0 $\mu$m. Thus, such a grain size is too large to roughen the polysilicon layer which is as thick as 0.5 $\mu$m. This makes it difficult to widen the effective surface area of the polysilicon layer roughened.

SUMMARY OF THE INVENTION

It is therefore an object of this invention to provide a method of manufacturing a product, which is capable of largely roughening an overall surface of a layer with an excellent reproducibility.

It is another object of this invention to provide a method of the type described, which is capable of widening an effective area of the layer.

It is still another object of this invention to provide a method of manufacturing a semiconductor device as the product.

It is yet another object of this invention to provide a method of manufacturing a stacked capacitor included in the semiconductor device.

It is another object of this invention to provide a method of the type described, which is capable of widening an effective surface area of a polysilicon layer used in the stacked capacitor.

It is another object of this invention to provide a method of the type described, which can manufacture the stacked capacitor which is large in capacitance.

According to an aspect of this invention, a method is for use in manufacturing a semiconductor device. The method comprises the steps of forming a polysilicon layer of a random crystal structure on a semiconductor substrate and etching the polysilicon layer by an etchant to roughen a surface of the polysilicon layer.

Specifically, the step of forming the polysilicon layer is carried out by an LPCVD method using a gas containing $SiH_4$ at a pressure between 0.5 and 10 Torr and a growth temperature between 650° and 750° C.

Alternatively, the step of forming the polysilicon layer is carried out by an LPCVD method using a gas containing $SiH_4$ at a pressure between 10 and 100 Torr and a growth temperature between 600° and 750° C. and is followed by a heat treatment at a temperature between 700° and 900° C.

Furthermore, the step of forming the polysilicon layer may comprise the steps of depositing the polysilicon layer, carrying out ion implantation into the polysilicon layer to transform at least a surface of the polysilicon layer into an amorphous phase, and heat-treating the polysilicon layer to crystallize the polysilicon layer.

On the other hand, the step of etching the polysilicon layer is carried out by immersing the polysilicon layer in a phosphoric acid solution of a high concentration.

The polysilicon layer thus obtained may be used as a lower electrode of the stacked capacitor. The stacked capacitor may be manufactured by the step of successively depositing a capacitor insulator layer on the lower electrode and an upper electrode on the capacitor insulator layer.

According to another aspect of this invention, a method is for use in obtaining a roughened layer included in a semiconductor device. The method comprises the steps of preparing a layer of a random crystal structure, and rendering the layer of the random crystal structure into the roughened layer.

The semiconductor device may be a stacked capacitor which comprises a lower electrode, an upper electrode opposed to the lower electrode, and an insulator layer between the lower and the upper electrodes. The lower electrode is structured by the roughened layer which may be formed by a polysilicon layer.

More specifically, the preparing step comprises the steps of providing a substrate and forming the polysilicon layer of a random crystal structure on the substrate as the layer of the random crystal structure. In this event, the forming step may be composed of a single step of depositing the polysilicon layer of the random crystal structure on the substrate or may be composed of the steps of depositing the polysilicon layer of a preselected crystal structure different from the random crystal structure and processing the preselected crystal structure into the random crystal structure to form the polysilicon layer of the random crystal structure.

DESCRIPTION OF THE PREFERRED EMBODIMENTS

Description will at first be made as regards conventional methods of manufacturing a semiconductor device in order to facilitate an understanding of this invention. A stacked capacitor will be described as an example of the semiconductor device.

Figure 1A:
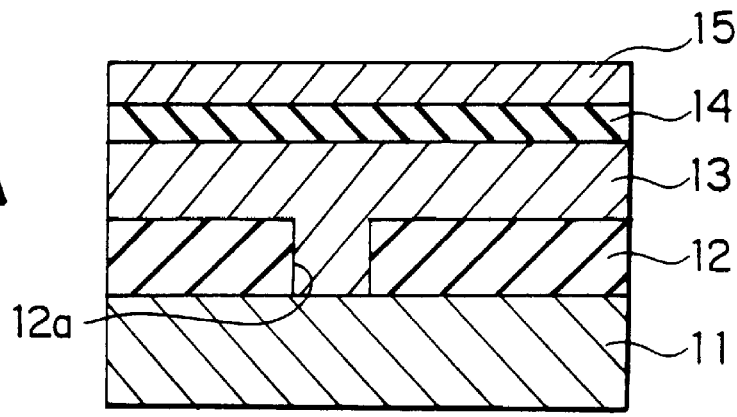
FIGS. 1A through 1D are sectional views for describing a conventional method of manufacturing a semiconductor device.

FIGS. 1A through 1D show a first conventional method which is disclosed in Japanese Unexamined Patent Publication No. 272165/1991 and which has been already mentioned as the first technique. In FIG. 1A, a first silicon oxide layer 12 is deposited on a silicon substrate 11. By the use of lithography and dry etching techniques, a contact hole 12a is formed in the first silicon oxide layer 12. Then, a first polysilicon layer 13 is grown on the first silicon oxide layer 12 by a chemical vapor deposition (CVD) method to a thickness between 200 and 500 nm. A second silicon oxide layer 14 is deposited on the first polysilicon layer 13 to a thickness between 100 and 300 nm. A second polysilicon layer 15 is grown on the second silicon oxide layer 14 to a thickness between 50 and 200 nm, respectively.

Figure 1B:
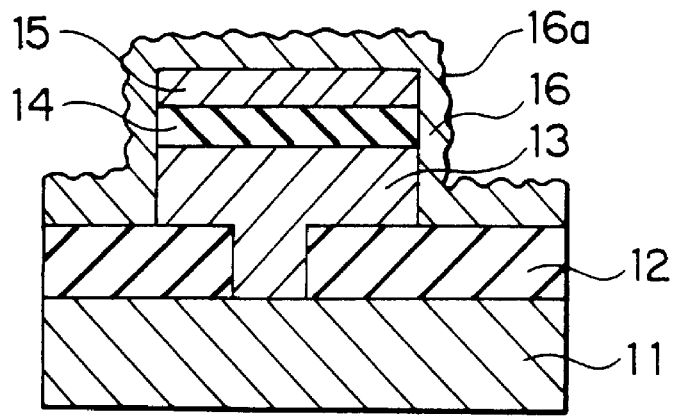

In FIG. 1B, a stack of the first polysilicon layer 13, the second silicon oxide layer 14, and the second polysilicon layer 15 is patterned by lithography and dry etching techniques into a shape of a lower electrode. By the use of a reactive gas containing 20% of $SiH_4$ and 80% of He, a third polysilicon layer 16 is deposited at a pressure of 1 Torr and a growth temperature of 550° C. within a transition temperature range to be integral with the second polysilicon layer 15. The resultant third polysilicon layer 16 has a roughened surface 16a. The roughened surface 16a has a surface area approximately equal to twice a flat surface area.

Figure 1C:
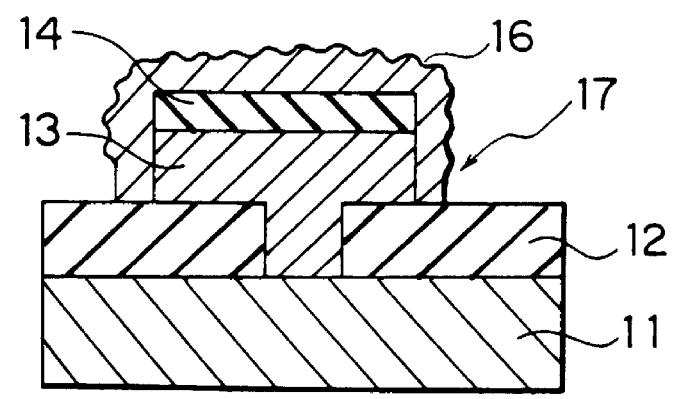

In FIG. 1C, an impurity, such as phosphorus, is doped into the third polysilicon layer 16 by a thermal diffusion technique. The third polysilicon layer 16 is etched back to the first silicon oxide layer 12 and the second polysilicon layer 15 by a dry etching technique to form a lower electrode 17. As a result, the third polysilicon layer 16 is left on a side surface of the lower electrode 17 with the second polysilicon layer 15 exposed and roughened like the third polysilicon layer 16.

Figure 1D:
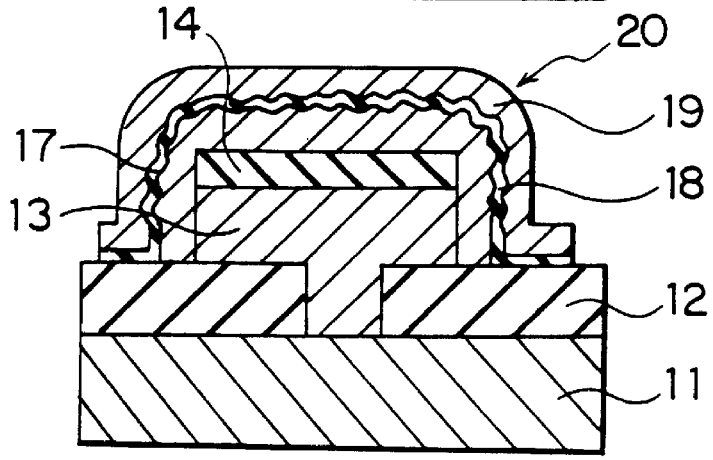

In FIG. 1D, a capacitor insulator layer 18 of a thin thickness is formed on the lower electrode 17. Thereafter, a fourth polysilicon layer 19 is deposited on the capacitor insulator layer 18. After an impurity, such as phosphorus, is doped into the fourth polysilicon layer 19, the fourth polysilicon layer 19 is patterned by lithography and dry etching techniques into an upper electrode 20.

The first conventional method is disadvantageous as mentioned in the preamble of the instant specification.

Figure 2A:
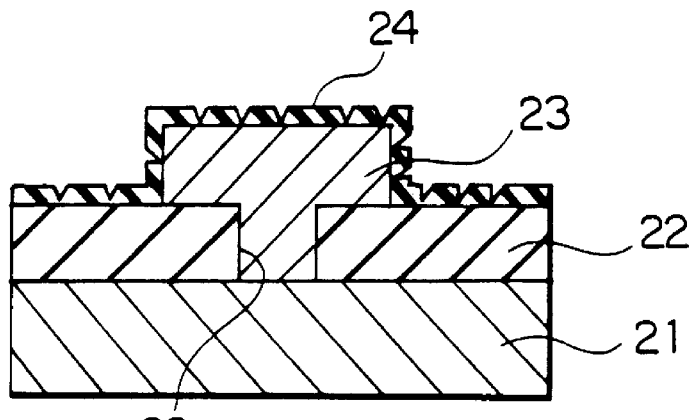
FIGS. 2A through 2D are sectional views for describing another conventional method of manufacturing a semiconductor device.

Referring to FIGS. 2A through 2D, description will be made as regards another conventional method that is substantially equivalent to the second technique mentioned in the preamble of the instant specification. As illustrated in FIG. 2A, a first silicon oxide layer 22 is deposited on a silicon substrate 21. After a contact hole 22a is formed in the first silicon oxide layer 22, a first polysilicon layer 23 is grown on the first silicon oxide layer 22 by a CVD method to a thickness between 200 and 500 nm. The first polysilicon layer 23 is patterned by lithography and dry etching techniques into a shape of a lower electrode. A pin-holed silicon nitride layer 24 is deposited on the first polysilicon layer 23 to a thickness approximately equal to 50 nm by a CVD method using a reactive gas containing $SiH_2Cl_2$ and $NH_3$.

Figure 2B:
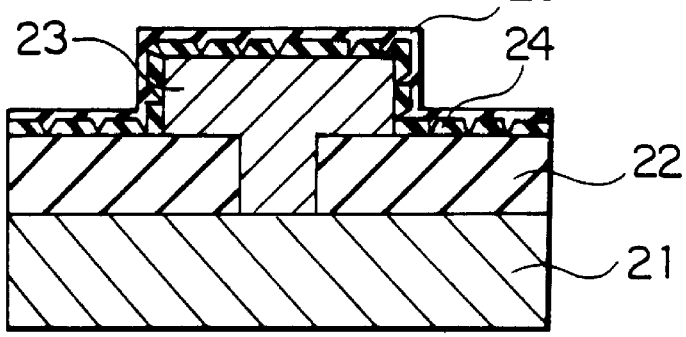

In FIG. 2B, the pin-holed silicon nitride layer 24 is introduced into an oxidization atmosphere and a second silicon oxide layer 25 is formed on the pin-holed silicon nitride layer 24. The second silicon oxide layer 25 serves to widen pinholes in the pin-holed silicon nitride layer 24.

Figure 2C:
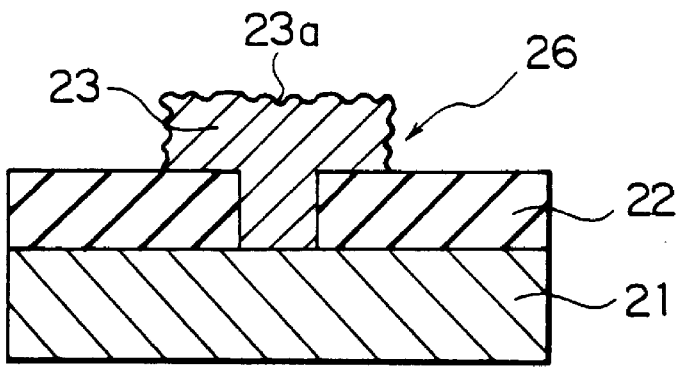

In FIG. 2C, the second silicon oxide layer 25 is removed by an aqueous solution of HF. By the use of an etchant, the first polysilicon layer 23 is etched through the pinholes formed in the silicon nitride layer 24 after the pinholes are expanded by the second silicon oxide layer 25. Then, the silicon nitride layer 24 is removed by an etching technique. Now, the first polysilicon layer 23 has a roughened surface 23a. The first polysilicon layer 23 serves as a lower electrode 26 which has a surface area approximately equal to 1.5 times a flat surface area.

Figure 2D:
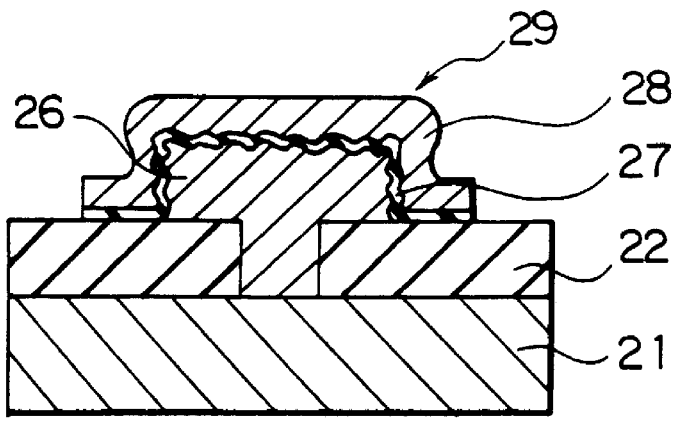

Turning to FIG. 2D, a capacitor insulator layer 27 is formed on the lower electrode 26. A second polysilicon layer 28 is deposited on the capacitor insulator layer 27 and is doped with an impurity, such as phosphorus. Thereafter, the second polysilicon layer 28 is patterned into an upper electrode 29 by lithography and dry etching techniques.

The above-mentioned conventional method has also shortcomings as described in the preamble of the instant specification. In addition, the size and the density of the pinholes are readily affected by presence of foreign particles.

Now, description will be made as regards preferred embodiments of this invention.

Figure 3A:
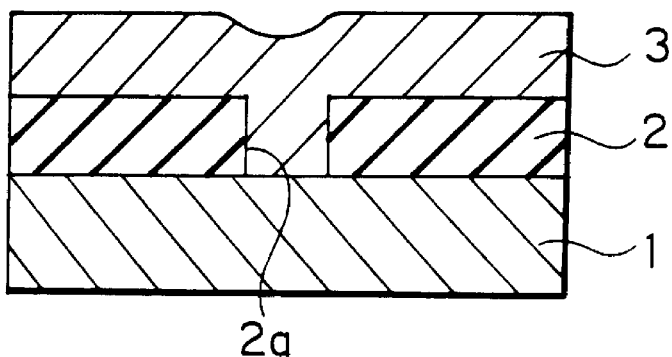
FIGS. 3A through 3D are sectional views for describing a method of manufacturing a semiconductor device according to a first embodiment of this invention.
Figure 3B:
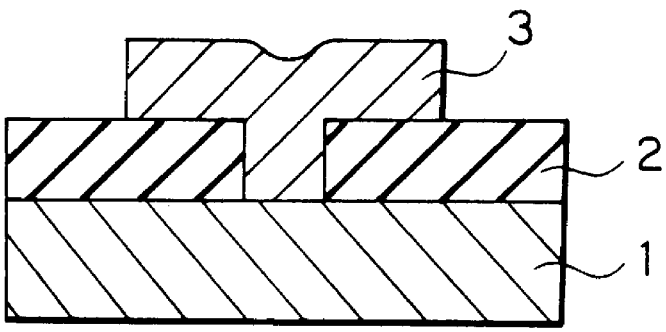

FIGS. 3A through 3D show a method of manufacturing, as a product, a semiconductor device including a stacked capacitor according to a first embodiment of this invention. For example, the stacked capacitor serves as a capacitor structure of a dynamic random access memory (DRAM). Referring to FIG. 3A, a silicon oxide layer 2 is deposited on a silicon substrate 1. A contact hole 2a is formed in the silicon oxide layer 2 by photolithography and dry etching techniques.

By the use of an LPCVD apparatus, a first polysilicon layer 3 is deposited on the silicon oxide layer 2 using a reactive gas containing $SiH_4$ and $PH_3$ at a pressure between 0.5 and 10 Torr and a growth temperature between 650° and 750° C. In the above-mentioned conditions, the first polysilicon layer 3 as deposited has a random crystal structure.

Figure 4A:
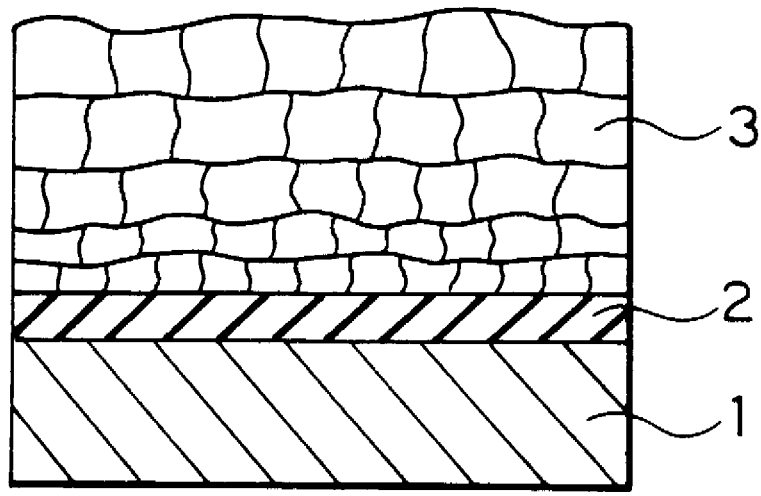
FIGS. 4A and 4B show polysilicon layers of a random crystal structure and a columnar crystal structure, respectively.
Figure 4B:
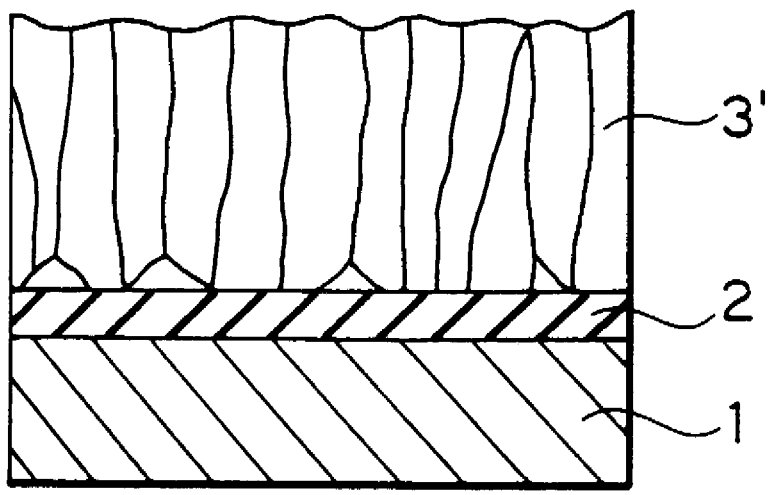

Temporarily referring to FIG. 4A, the random crystal structure is diagrammatically illustrated which includes grains of the first polysilicon layer 3. As shown in FIG. 4A, the grains are grown at random to form grain boundaries both in a vertical direction and in a horizontal direction. On the other hand, an ordinary polysilicon layer 3' has a columnar crystal structure in which the grains are grown in a vertical direction alone, as illustrated in FIG. 4B.

Now referring back to FIG. 3B, the first polysilicon layer 3 is patterned by photolithography and dry etching techniques into a shape of a lower electrode of the stacked capacitor.

Figure 3C:
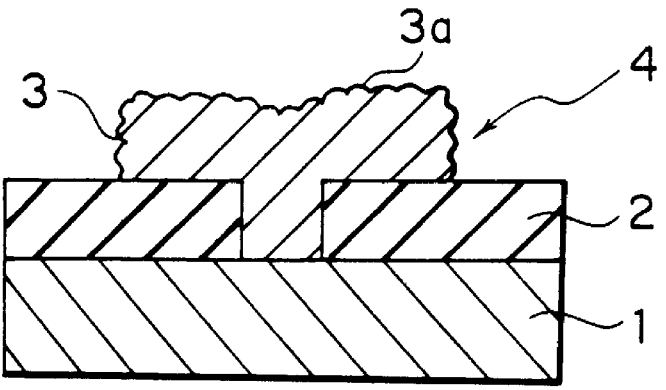

In FIG. 3C, the first polysilicon layer 3 is immersed in a phosphoric acid solution of a high concentration at a temperature between 150° and 170° C. for 30 to 180 minutes to partially etch or roughen the first polysilicon layer 3. As a result, the first polysilicon layer 3 is roughened to provide a roughened surface 3a. The first polysilicon layer 3 serves as the lower electrode (as depicted at 4).

Figure 3D:
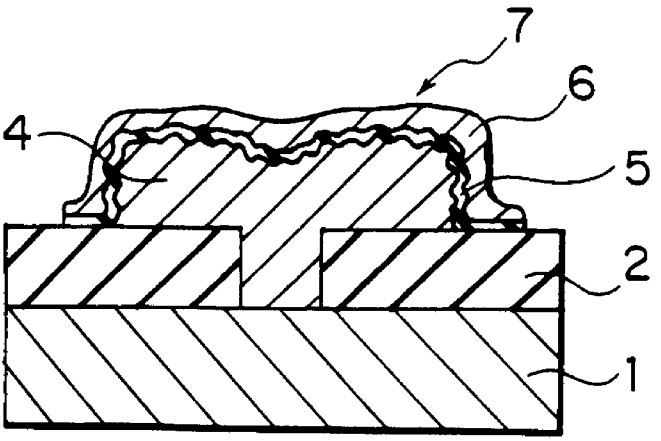

Subsequently, as illustrated in FIG. 3D, a thin silicon nitride layer and a silicon oxide layer are successively deposited by an LPCVD method to form a capacitor insulator layer 5. On the capacitor insulator layer 5, a second polysilicon layer 6 of an ordinary or columnar crystal structure is deposited by the LPCVD method to a thickness between 100 and 300 nm. After introducing an impurity such as phosphorus, the second polysilicon layer 6 is patterned by photolithography and dry etching techniques to serve as an upper electrode 7. Thus, a stacked capacitor is obtained.

According to the above-mentioned method, the lower electrode 4 has the roughened surface 3a formed by etching the first polysilicon layer 3 of a random crystal structure. In the random crystal structure, the grains and the grain boundaries are distributed at random both at top and side surfaces of the lower electrode 4. Since the etching operation by the phosphoric acid solution is advanced along the grains, the roughened surface 3a is formed on all of the top and the side surfaces of the lower electrode 4. As compared with the polysilicon layer 3' of a columnar crystal structure illustrated in FIG. 4B, the roughened surface 3a is formed also at the side surface of the lower electrode 4. Thus, the surface area is remarkably increased.

It is noted here that similar stacked capacitors are practically arranged on the silicon substrate together with any other semiconductor elements, although the single stacked capacitor is illustrated in the figure for convenience of description.

Figure 5:
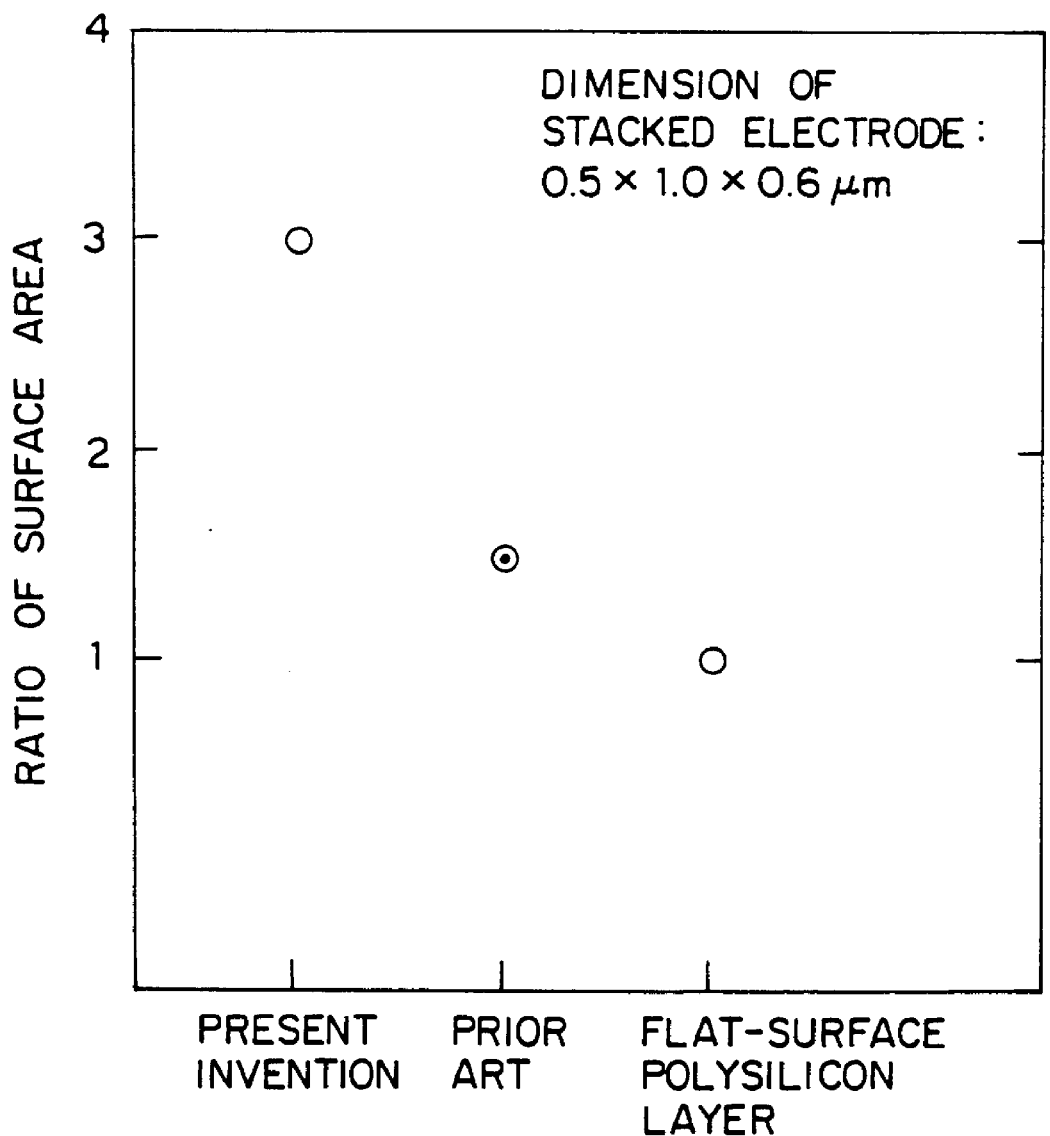
FIG. 5 is a graph for describing an increase of a surface area of a lower electrode according to this invention.

Referring to FIG. 5, comparison is made between surface areas of the roughened surfaces of the conventional polysilicon layer of a columnar crystal structure and the polysilicon layer of a random crystal structure according to this invention. It is assumed here that a flat-surface polysilicon layer has a reference surface area or a flat surface area which is represented by 1. As clearly seen from FIG. 5, the conventional polysilicon layer of a columnar crystal structure has an increased surface area of about 1.4 because no roughness is formed on the side surface. On the other hand, the polysilicon layer of the random crystal structure according to this invention has an increased surface area of about 3, as shown in FIG. 5.

Accordingly, in the stacked capacitor illustrated in FIG. 3, an effective surface area defined by opposing surfaces of the upper and the lower electrodes 7 and 4 opposite to each other via the capacitor insulator layer 5 is widened to approximately three times the reference surface area. With such a minimized planar area, the stacked capacitor having a remarkably increased capacitance is achieved. According to the method of this invention, the polysilicon layer of a random crystal structure can be repeatedly produced with a substantially similar grain structure if a constant deposition condition is assured. Thus, reproducibility of the grain structure is excellent. If a constant etching condition is assured in the subsequent etching operation, the roughened surface can be repeatedly produced with an excellent reproducibility. Thus, mass producibility is improved.

The polysilicon layer of a random crystal structure may be formed in the following manner. Specifically, a polysilicon layer of an ordinary or columnar crystal structure is deposited using a reactive gas containing $SiH_4$ and $PH_3$ at a pressure between 10 and 100 Torr and a growth temperature between 600° and 750° C. Subsequently, the polysilicon layer of a columnar crystal structure is subjected to a heat treatment at a temperature between 700° and 900° C. to be transformed into a random crystal structure. Alternatively, the polysilicon layer of a columnar crystal structure is grown at a growth temperature between 550° and 600° C. and a pressure between 0.1 and 2 Torr and then subjected to a similar heat treatment to be transformed into a random crystal structure.

The polysilicon layer may be deposited using an $SiH_4$ gas alone and then transformed into a random crystal structure in the manner similar to that mentioned above. Thereafter, phosphorus is diffused to form the polysilicon layer of a random crystal structure containing phosphorus.

Upon forming the roughness by the etching operation, the roughness can be enlarged on demand. For example, the surface of the polysilicon layer is etched by the use of an aqueous solution of ammonia and hydrogen peroxide.

FIGS. 6A through 6D show a method of manufacturing a semiconductor device according to a second embodiment of this invention. Herein, a part of the method is illustrated until formation of a lower electrode roughened. At first, referring to FIG. 6A, a silicon oxide layer 2 is deposited on a silicon substrate 1. The silicon oxide layer 2 is etched by photolithography and dry etching techniques to form a contact hole 2a. By the use of an LPCVD method, a first polysilicon layer 3' is deposited on the silicon oxide layer 2 using an $SiH_4$ gas to a thickness between 200 and 600 nm. According to the inventor's observation, it has been found out that the first polysilicon layer 3' has a columnaer structure. After deposition, the first polysilicon layer 3' is patterned by photolithography and dry etching techniques into a shape of a lower electrode.

Figure 6A:
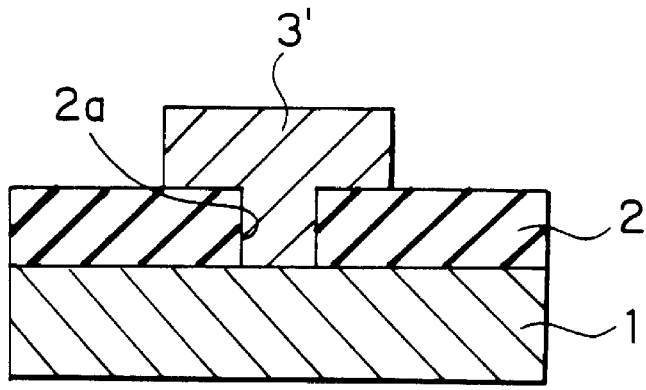
FIGS. 6A through 6D are sectional views for describing a method of manufacturing a semiconductor device according to a second embodiment of this invention.
Figure 6B:
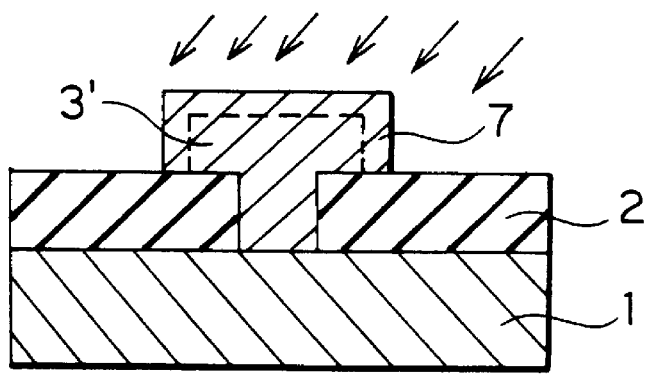

Next referring to FIG. 6B, an impurity, such as phosphorus, is doped by ion implantation into the first polysilicon layer 3' to a phosphorus concentration between 5E19 and 5E20 atom/cm³. At this time, an ion beam of phosphorus is introduced at an angle oblique to the polysilicon layer 3' so that phosphorus is implanted also into a side surface of the polysilicon layer 3'. In an ion-implanted surface region of the polysilicon layer 3', a crystal structure of polysilicon is disturbed or scattered by ion implantation. As a consequence, the surface region is transformed into an amorphous phase to provide an amorphous silicon region 7. It has been found out that the amorphous silicon region 7 processed in the above-mentioned manner is not completely rendered amorphous and contains nuclei in the form of fine crystals. Under the circumstances, the illustrated amorphous silicon region 7 will be referred to as a quasi-amorphous silicon region.

Figure 6C:
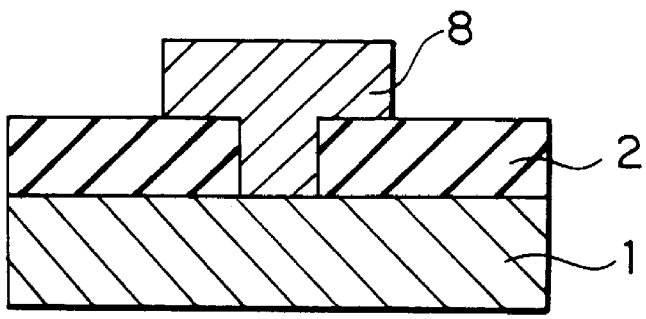

Referring to FIG. 6C, a heat treatment is carried out in a nitrogen atmosphere at a temperature between 600° and 900° C. As a result, the quasi-amorphous silicon region 7 is crystallized and transformed into a polysilicon layer 8. Since the quasi-amorphous silicon region 7 contains the fine crystals, crystallization by the heat treatment is advanced around the nuclei formed by the fine crystals. The polysilicon layer 8 which may be called a processed polysilicon layer therefore has a random crystal structure.

Figure 6D:
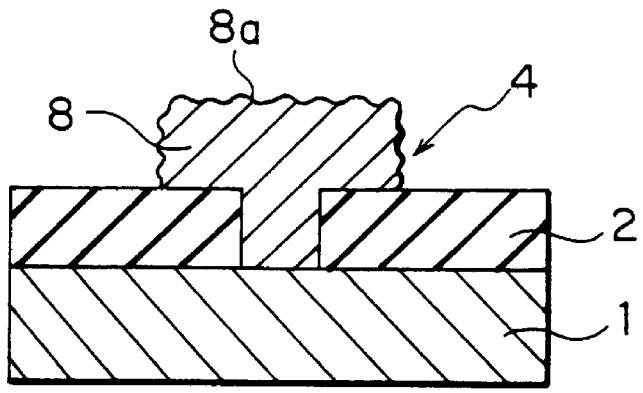

Referring to FIG. 6D, the processed polysilicon layer 8 of the random crystal structure is immersed in a phosphoric acid solution of a high concentration at a temperature between 150° and 170° C. for 30 to 180 minutes in a manner similar to the first embodiment. Then, the processed polysilicon layer 8 is etched to roughen a surface 8a as a roughened surface. The roughened surface 8a is formed on both of top and side surfaces of the processed polysilicon layer 8, like in the first embodiment. The processed polysilicon layer 8 serves as a lower electrode 4.

Although not shown in the figure, it will be understood that a capacitor insulator layer and an upper electrode are successively deposited to obtain a capacitor. Thus, in this second embodiment also, it is possible to obtain the capacitor which has a widened surface area of about three times of a reference flat surface and an increased capacitance.

In the second embodiment, the random crystal structure is formed by thermal oxidation of the polysilicon layer after ion implantation of phosphorus. Alternatively, the random crystal structure may be formed by introducing phosphorus by a phosphorus diffusion technique after ion implantation of silicon. In case where the phosphorus concentration is still low after the polysilicon layer of a random crystal structure is formed, phosphorus is additionally introduced by the phosphorus diffusion technique. If necessary, the grains in the polysilicon layer can be enlarged by a heat treatment at a temperature between 700° and 900° C. after a random crystal structure is formed in the polysilicon layer.

According to this invention, the random crystal structure is obtained by at first depositing the polysilicon layer of an ordinary or columnar crystal structure. The polysilicon layer is thereafter subjected to ion implantation to provide a quasi-amorphous region. It is noted here that the quasi-amorphous region is not completely put into an amorphous state but leaves a large number of nuclei for subsequent recrystallization, without being rendered amorphous. The nuclei are recrystallized into a number of grains which are very fine. This means that a great number of grain boundaries are formed among the grains and are helpful to roughen a recrystallized layer. As a result, the capacitance can be increased. In addition, the grain size is found to be uniform, which results in a uniform distribution of the capacitance. Practically, a lot of the grains of a small size between 0.05 and 0.25 $\mu$m are created and uniformly distributed. Such a uniform distribution of the grains serves to form a uniform capacitance.

Figure 7A:
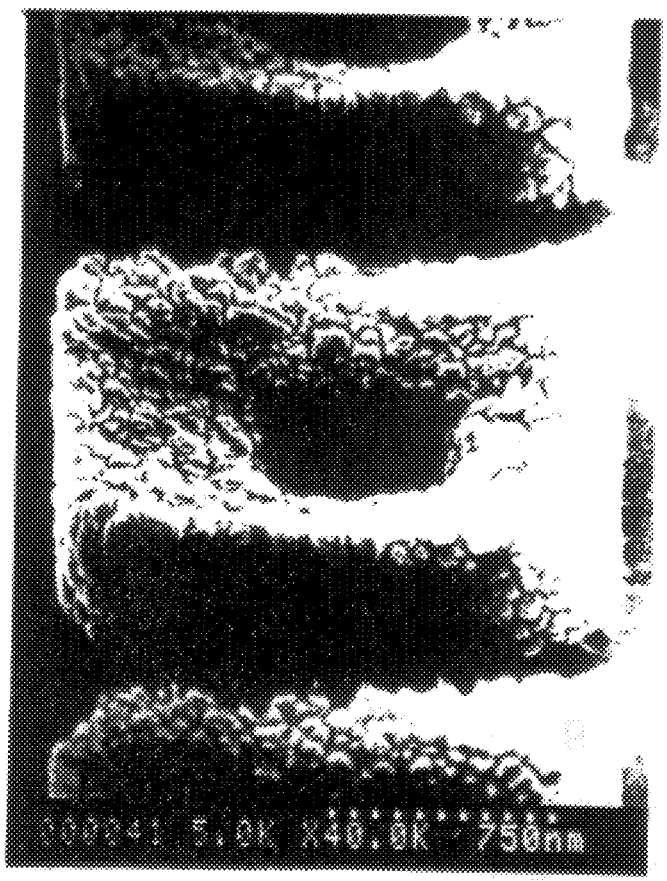
FIGS. 7A and 7B are photographs showing a perspective view and a sectional view of the polysilicon layer of a random crystal structure, respectively.
Figure 7B:

Referring to FIGS. 7A and 7B, the random crystal structure will be clearly defined for a better understanding of this invention. FIGS. 7A and 7B show photographs of polysilicon layers or layer having random crystal structures according to this invention. In FIG. 7A, the polysilicon layers are perspectively taken by a scanning electron microscope (SEM) at a magnification of 40,000 while the polysilicon layer of FIG. 7B is taken in a cross-section by the same SEM at a magnification of 100,000.

Herein, the polysilicon layers shown in FIGS. 7A and 7B were deposited by the use of an LPCVD apparatus. Specifically, the polysilicon layers were deposited to a thickness of 600 nm in an atmosphere of the reactive gas which contained $SiH_4$ and $PH_3$ and which was kept at a pressure of 60 Torr and a growth temperature of 675° C. By the use of photolithography and dry etching techniques, the polysilicon layers were patterned into a shape of a lower electrode and then immersed in a phosphoric acid solution of a high concentration at a temperature between 150° and 170° C.

The resultant polysilicon layers had an aggregation of grains which were stacked in horizontal and vertical directions, as shown in FIGS. 7A and 7B. As readily understood from FIGS. 7A and 7B, all of the grains were present within a size range between 0.05 and 0.25 μm. Accordingly, the random crystal structure of this invention may be defined as the aggregation of the grains between 0.05 and 0.25 μm.

As described above, according to this invention, the polysilicon layer of a random crystal structure is formed on the semiconductor substrate and is etched by the etchant to produce the roughened surface of the polysilicon layer. Accordingly, the roughened surface is formed on all of the top and the side surfaces of the polysilicon layer. It is therefore possible to form an electrode having a remarkably increased surface area relative to the planar area of the polysilicon layer. When the stacked capacitor is formed by the use of the polysilicon layer as the lower electrode, the capacitor structure having an increased capacitance with a minimized planar area can be obtained. Thus, a highly integrated DRAM is achieved.

As described, the step of forming the polysilicon layer of a random crystal structure is carried out by the LPCVD method using the gas containing $SiH_4$ at a pressure between 0.5 and 10 Torr and a growth temperature between 650° and 750° C. Thus, the polysilicon layer of a random crystal structure is formed in a single step. As a result, the number of steps can be effectively reduced.

The polysilicon layer of a random crystal structure can also be formed by the steps of depositing a polysilicon layer of a columnar crystal structure, carrying out ion implantation into the polysilicon layer to transform at least the surface of the polysilicon layer into an amorphous phase, and heat-treating the polysilicon layer to crystallize the polysilicon layer. It is thus possible to form the polysilicon layer of a random crystal structure even when the polysilicon layer is deposited under the condition similar to the conventional method.

The etching operation is carried out by immersing the polysilicon layer in the phosphoric acid solution of a high concentration. Accordingly, the roughened surface can be formed in such a very simple manner.

While this invention has thus far been described in conjunction with the preferred embodiments, it will readily be possible for those skilled in the art to put this invention into practice in varius other manners.

For example, phorphorus is doped in the first and the second embodiments as an impurity into the polysilicon layer to form the polysilicon layer having a roughened surface. However, other impurities, such as arsenic (As), may be used instead of phosphorus. The polysilicon layer can be deposited by the use of an $Si_2H_6$ gas in place of the $SiH_4$ gas.

In each of the above-mentioned embodiments, the surface area of the roughened surface of the polysilicon layer as the lower electrode is increased to three times the flat surface area. If the thickness of the polysilicon layer is increased and the etching time by the phosphoric acid solution is prolonged, the roughened surface can have a further widened area and thereby increase the surface area to more than three times. Accordingly, this invention is also applicable as a capacitor structure for use in a highly integrated semiconductor device of a scale greater than 64 MDRAM.

What is claimed is:

1. A method of manufacturing a semiconductor device, comprising the steps of:

forming a polysilicon layer of a random crystal structure on a semiconductor substrate, said polysilicon layer having a top surface and a side surface contiguous to the top surface;

etching said polysilicon layer by an etchant to roughen said top surface of said polysilicon layer and also the side surface of said polysilicon layer.

2. A method as claimed in claim 1, wherein the step of forming said polysilicon layer is carried out by an LPCVD method using a gas containing $SiH_4$ at a pressure between 0.5 and 10 Torr and a growth temperature between 650° and 750° C.

3. A method as claimed in claim 1, wherein the step of forming said polysilicon layer is carried out by an LPCVD method using a gas containing $SiH_4$ at a pressure between 10 and 100 Torr and a growth temperature between 600° and 750° C., said step being followed by a heat treatment at a temperature between 700° and 900° C.

4. A method as claimed in claim 1, wherein the step of forming said polysilicon layer comprises the steps of depositing said polysilicon layer, carrying out ion implantation into said polysilicon layer to transform at least a surface of said polysilicon layer into an amorphous phase, and heat-treating said polysilicon layer to crystallize said polysilicon layer.

5. A method as claimed in claim 1, wherein the step of etching said polysilicon layer is carried out by immersing said polysilicon layer in a phosphoric acid solution of a high concentration.

6. A method as claimed in claim 1, wherein said polysilicon layer is formed as a lower electrode of a stacked capacitor, said method further comprising the step of successively depositing a capacitor insulator layer on a surface of said polysilicon layer and an upper electrode on said capacitor insulator layer.

7. A method as claimed in claim 2, wherein the step of etching said polysilicon layer is carried out by immersing said polysilicon layer in a phosphoric acid solution of a high concentration.

8. A method as claimed in claim 2, wherein said polysilicon layer is formed as a lower electrode of a stacked capacitor, said method further comprising the step of successively depositing a capacitor insulator layer on a surface of said polysilicon layer and an upper electrode on said capacitor insulator layer.

9. A method as claimed in claim 3, wherein the step of etching said polysilicon layer is carried out by immersing said polysilicon layer in a phosphoric acid solution of a high concentration.

10. A method as claimed in claim 3, wherein said polysilicon layer is formed as a lower electrode of a stacked capacitor, said method further comprising the step of successively depositing a capacitor insulator layer on a surface of said polysilicon layer and an upper electrode on said capacitor insulator layer.

11. A method as claimed in claim 4, wherein the step of etching said polysilicon layer is carried out by immersing said polysilicon layer in a phosphoric acid solution of a high concentration.

12. A method as claimed in claim 4, wherein said polysilicon layer is formed as a lower electrode of a stacked capacitor, said method further comprising the step of successively depositing a capacitor insulator layer on a surface of said polysilicon layer and an upper electrode on said capacitor insulator layer.

13. A method as claimed in claim 5, wherein said polysilicon layer is formed as a lower electrode of a stacked capacitor, said method further comprising the step of successively depositing a capacitor insulator layer on a surface of said polysilicon layer and an upper electrode on said capacitor insulator layer.

14. A method of obtaining a roughened layer included in a semiconductor device, comprising the steps of:

preparing a layer having a top surface and a contiguous side surface of a random crystal structure; and rendering said top and side surfaces of the random crystal structure into said roughened layer.

15. A method as claimed in claim 14, wherein said semiconductor device is a stacked capacitor which comprises a lower electrode, an upper electrode opposed to said lower electrode, and an insulator layer between said lower and said upper electrodes.

16. A method as claimed in claim 15, wherein said lower electrode is formed by said roughened layer.

17. A method as claimed in claim 16, wherein said roughened layer is formed by a polysilicon layer.

18. A method as claimed in claim 17, wherein the preparing step comprises the steps of:

providing a substrate; and forming the polysilicon layer of a random crystal structure on the substrate as said layer of the random crystal structure.

19. A method as claimed in claim 18, wherein the forming step comprises the step of:

depositing the polysilicon layer of the random crystal structure on the substrate.

20. A method as claimed in claim 18, wherein the forming step comprises the step of:

depositing the polysilicon layer of a preselected crystal structure different from the random crystal structure; and processing the preselected crystal structure into the random crystal structure to form the polysilicon layer of the random crystal structure.

* * * * *